United States Patent
Benzel et al.

(10) Patent No.: US 6,803,637 B2
(45) Date of Patent: Oct. 12, 2004

(54) MICROMECHANICAL COMPONENT WITH DIFFERENT DOPING TYPES SO THAT ONE TYPE IS ANODIZED INTO POROUS SILICON

(75) Inventors: Hubert Benzel, Pliezhausen (DE); Heribert Weber, Nuertingen (DE); Hans Artmann, Magstadt (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/169,464
(22) PCT Filed: Oct. 6, 2001
(86) PCT No.: PCT/DE01/03839
§ 371 (c)(1),
(2), (4) Date: Oct. 28, 2002
(87) PCT Pub. No.: WO02/36484
PCT Pub. Date: May 10, 2002

(65) Prior Publication Data
US 2003/0116813 A1 Jun. 26, 2003

(30) Foreign Application Priority Data
Nov. 3, 2000 (DE) .......................................... 100 54 484
(51) Int. Cl.⁷ .......................... B81B 3/00; H01L 21/00; H01L 29/84
(52) U.S. Cl. ...................... 257/414; 257/619; 205/656; 216/3; 216/56
(58) Field of Search ................................ 257/414–419, 257/420, E21.216, E29.082, 5,834,333 A * 11/1998 Seefeldt et al. . 438/52 E29.324, 3, 619; 438/50–53; 73/514.32, 514.35; 216/2, 56

(56) References Cited

U.S. PATENT DOCUMENTS

| | | | |
|---|---|---|---|
| 4,532,700 A | * 8/1985 | Kinney et al. | .............. 438/409 |
| 5,405,786 A | 4/1995 | Kurtz | |
| 5,834,333 A | * 11/1998 | Seefeldt et al. | ............... 438/52 |
| 2002/0170875 A1 | * 11/2002 | Benzel et al. | .................. 216/2 |

FOREIGN PATENT DOCUMENTS

| | | |
|---|---|---|
| DE | 195 378 14 | 4/1997 |
| EP | 0 747 684 | 12/1996 |
| EP | 1 011 130 | 6/2000 |
| WO | WO 97 49475 | 12/1997 |
| WO | WO 99 45583 | 9/1999 |

OTHER PUBLICATIONS

Rinke et al., "Quasi–monocrystalline Silicon for Thin–film Devices," Applied Phys. A, vol. 68, 705–707 (1999).*
Imai et al; "FIPOS (Full Isolation by Porous Oxidized Silicon) Technology and Its Application to LSI's." IEEE Transactions on Electron Devices. vol. ED–31, No. 3, Mar. 1984; pp. 297–302.*
K. Imai, "A New Dielectric Isolation Method Using Porous Silicon," Solid State Electronics, vol. 24, No. 2, Feb. 1981, pp. 159–164.*
G. Lamme & P. Renaud, "Free–standing Mobile 3D Microstructures of Porous Silicon," pp. 535–536, Proceedings of the 13* Europe–an Conference on Solid–state Transducers, Eurosensors XIII, ne Hague, 1999**.*
G. Lamme & P. Renaud, "Free–standing Mobile 3D Microstructures of Porous Silicon," pp. 535–536, Proceedings of the 13$^{th}$ European Conference on Solid–State Transducers, Eurosensors XIII, The Hague, 1999**.

* cited by examiner

Primary Examiner—Minhloan Tran
Assistant Examiner—Thomas L Dickey
(74) Attorney, Agent, or Firm—Kenyon & Kenyon (57) ABSTRACT

A micromechanical component having a substrate made from a substrate material having a first doping type, a micromechanical functional structure provided in the substrate and a cover layer to at least partially cover the micromechanical functional structure. The micromechanical functional structure has zones made from the substrate material having a second doping type, the zones being at least partially surrounded by a cavity, and the cover layer has a porous layer made from the substrate material.

17 Claims, 9 Drawing Sheets

MICROMECHANICAL COMPONENT WITH DIFFERENT DOPING TYPES SO THAT ONE TYPE IS ANODIZED INTO POROUS SILICON

FIELD OF THE INVENTION

The present invention relates to a micromechanical component having a substrate made from a substrate material having a first doping, a micromechanical functional structure provided in the substrate and a cover layer to at least partially cover the micromechanical functional structure. The present invention also relates to a method for manufacturing a micromechanical component.

BACKGROUND INFORMATION

Micromechanical function is understood to include active function, e.g., a sensor function, or passive function, e.g., a printed conductor function.

Although it may be applied to any micromechanical component and structure, such as, for example, sensors and actuators, an exemplary embodiment according to the present invention and the underlying problem are elucidated with reference to a micromechanical component, e.g., an acceleration sensor, which may be manufactured, for example, using a silicon surface micromachining technology.

Monolithically integrated inertial sensors produced by surface micromachining technology, in which the sensitive movable structures are situated on the chip without protection (analog devices), may result in increased expenses for handling and packaging.

This problem may be circumvented by a sensor having an evaluation circuit on a separate chip, e.g., covering the structures produced by surface micromachining with a second cap wafer. This type of packaging may constitute a large share of the cost of manufacturing an acceleration sensor by surface micromachining. These costs may arise, for example, as a result of the high surface area required between the cap wafer and the sensor wafer and due to structuring (2–3 masks, bulk micromechanics) of the cap wafer.

The structure of a functional layer system and a method for the hermetic capping of sensors using surface micromachining is referred to in German Published Patent Application No. 195 37 814, in which the production of a sensor structure is explained. The cited hermetic capping is performed using a separate cap wafer of silicon, which may be structured using expensive structuring processes, such as KOH etching. The cap wafer is applied to the substrate with the sensor (sensor wafer) using a seal glass. This requires a wide bonding frame around each sensor chip to ensure an adequate adhesion and seal integrity of the cap. This may limit the number of sensor chips per sensor wafer. Due to the large amount of space required and the expensive production of the cap wafer, sensor capping may incur considerable costs.

Figure 10:
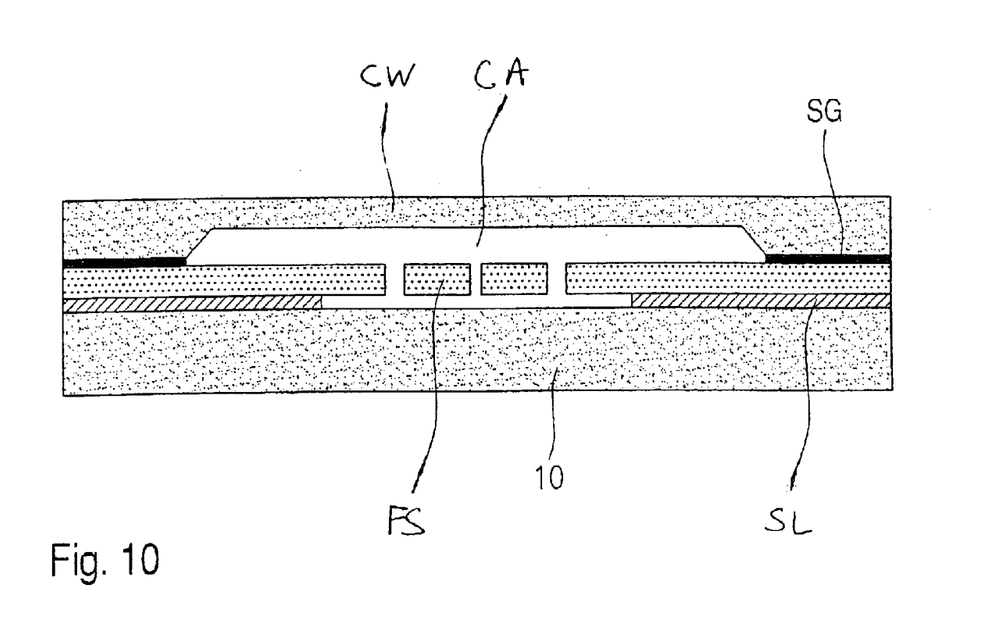
FIG. 10 is a cross-sectional view of a micromechanical component.

FIG. 10 is a schematic cross-sectional view of a micromechanical component.

As shown in FIG. 10, a semiconductor substrate is identified as 10, a sacrificial layer as SL, a functional level having a micromechanical functional structure (e.g., an acceleration sensor) as FS, a seal glass as SG, a cavity as CA and a cap wafer as CW. As described above, the corresponding manufacturing process may be expensive since it requires two wafers, for example, a substrate wafer 10 and a cap wafer CW, which may be adjusted to each other.

The production of a cavity under a porous silicon layer is referred to in G. Lammel, P. Renaud, "Free-standing mobile 3D microstructures of porous silicon," Proceedings of the 13th European Conference on Solid-State Transducers, Eurosensors XIII, The Hague, 1999, pages 535–536.

SUMMARY OF THE INVENTION

It is believed that an exemplary micromechanical component and manufacturing method according to the present invention allow a simple and cost-effective manufacturing of a micromechanical component, e.g., an acceleration sensor, a micropump, a flow channel, a check valve, a flow regulator, etc., using porous substrate material.

The use of such porous substrate material, e.g., porous silicon, may permit simple production of a cavity having a superimposed diaphragm in one process step. The micromechanical structures may be produced in the same process step. Thus, it is believed that advantages of an exemplary micromechanical component according to the present invention and an exemplary method for manufacturing the same include:

the production of micromechanical structures in a cavity having a superimposed diaphragm in one process step;

the exclusion of the cap wafer with wafer-to-wafer adjustment;

the inclusion of a vacuum in the cavity; and the production of structures having complex depth profiles.

An exemplary embodiment according to the present invention is based on the micromechanical functional structure having zones made from the substrate material having a second doping, the zones being at least partially surrounded by a cavity, and the cover layer having a porous layer made from the substrate material. During manufacturing, the p-doped zones may be readily etched, when the substrate is anodized. However, the n-doped zones may not be etched or only their surfaces may be insignificantly etched.

According to an exemplary embodiment of the present invention, a sealing layer seals the pores of the porous layer. In this manner, a predetermined atmosphere under the diaphragm may be set.

According to another exemplary embodiment of the present invention, the sealing layer has an oxide layer formed on the porous zone.

According to still another exemplary embodiment of the present invention, at least one of the zones made from the substrate material having the second doping type has a supporting zone to support the porous zone.

According to yet another exemplary embodiment of the present invention, at least one of the zones made from the substrate material having the second doping type is completely detached from its surroundings.

According to still another exemplary embodiment of the present invention, the cavity includes a flow channel, which may be connected by at least two back openings.

According to yet another exemplary embodiment of the present invention, the back openings are each connected by one transfer opening, which is formed in the zone.

According to still another exemplary embodiment of the present invention, a sealing layer seals the pores of the porous layer and a detection device situated on the sealing layer piezoresistively detects the flow rate.

According to yet another exemplary embodiment of the present invention, a check valve device is provided above a corresponding transfer opening within the flow channel, the check valve device having at least one of the zones made from the substrate material having the second doping type, which is detached from its surroundings or is resiliently connected to the substrate material.

According to still another exemplary embodiment of the present invention, two check valve devices of different dimensions are provided above a corresponding transfer opening, a sealing layer sealing the pores of the porous layer and the porous zone, the sealing layer being operable as a pump diaphragm.

According to yet another exemplary embodiment of the present invention, the cavity includes a circular inner flow channel and a concentric outer flow channel, which are connected by radial ports in a separation zone made from the substrate material having the second doping type, the inner flow channel being interrupted by a bar and a back inlet opening being provided on one side of the bar and a first back outlet opening being provided on the other side of the bar and a second back outlet opening being provided in the outer flow channel, so that a medium, flowing through the back inlet opening, may be separated, specific to mass, by centrifugal force, through the first and second back outlet opening.

According to still another exemplary embodiment of the present invention, the substrate has at least one trench, which is partially filled with a doping material of the second doping type and partially filled with a filler.

According to yet another exemplary embodiment of the present invention, the substrate material is silicon.

According to still another exemplary embodiment of the present invention, the zones made from the substrate material having the second doping type are provided in the substrate at different depths.

DETAILED DESCRIPTION

In the figures, identical symbols denote identical or functionally equivalent components.

Figure 1A:
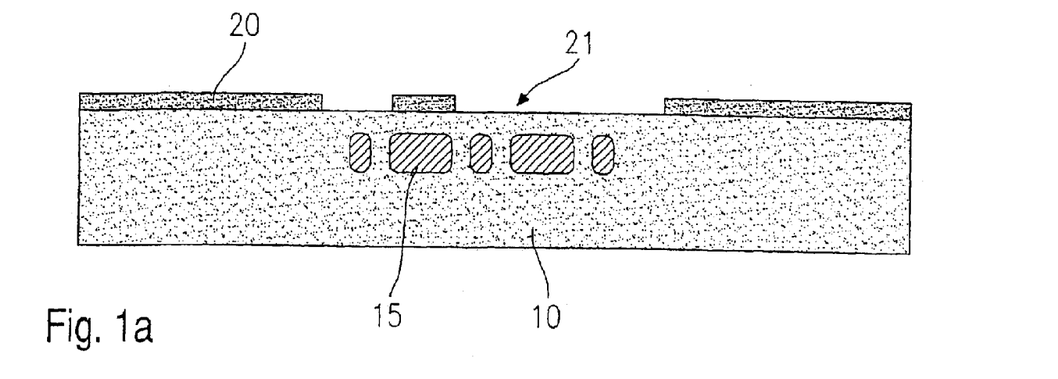
FIGS. 1a–1c are cross-sectional views of a micromechanical component manufactured using an exemplary manufacturing method for manufacturing the micromechanical component according to the present invention.
Figure 1B:
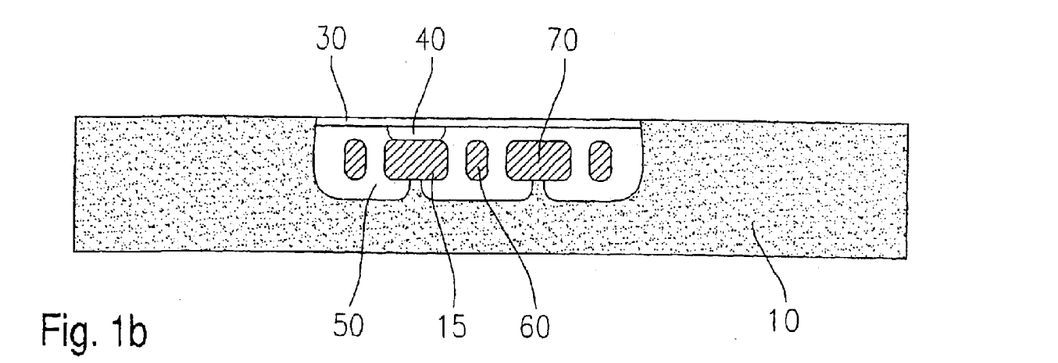
Figure 1C:
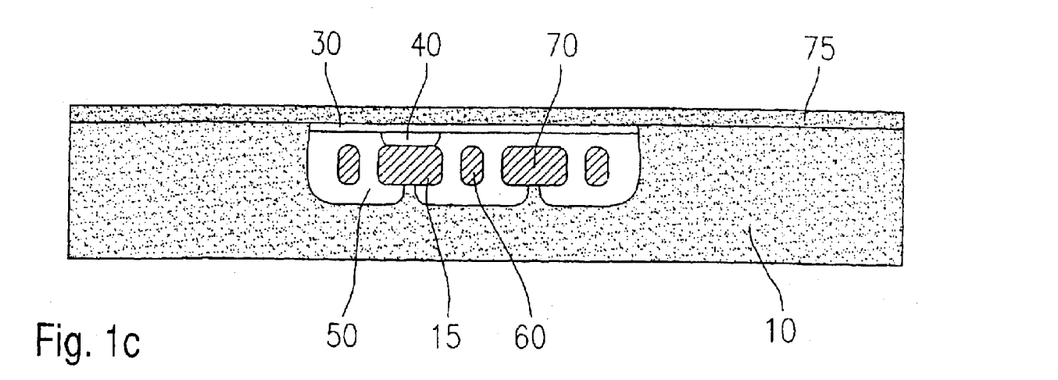

FIGS. 1a–1c are schematic views in cross-section of an exemplary micromechanical component manufactured using manufacturing method for manufacturing the micromechanical component according to the present invention.

As shown in FIG. 1a, the micromechanical component includes a p-doped wafer substrate 10 made of silicon, n-doped zones 15 in substrate 10, a metal mask 20 and metal mask openings 21.

First, the n-doped zones 15 are produced in p-doped substrate 10, for example, using standard semiconductor processes, such as an implantation method, in which the penetration depth with a corresponding distribution may be determined by adjusting the energy. The n-doped zones 15 are situated at a specific depth below the substrate surface and may, for example, also be situated on the substrate surface (not shown).

Then, parts of the substrate surface are masked using metal mask 20. A nitride mask, an oxinitride mask, etc., may be used instead of the metal mask 20.

As shown in FIG. 1b, the n-doped zones 15 of substrate 10 defined by mask 20 are etched electrochemically by hydrofluoric acid (HF) to make them porous. The porosity is controlled by the current density. Initially, a low current density is applied, resulting in the production of a layer of low porosity. The current density is then raised above a critical value. In addition, the hydrofluoric acid concentration may be reduced, or other solutions that inhibit $H_2$ formation may be used. As a result, the pores in the lower zone of a porous layer 30 become sized, so that the substrate material is essentially or entirely etched away and a cavity 50 is formed under the remaining porous layer 30. In this case, the term electropolishing is used. The material is removed through porous layer 40.

The structure formed in the functional level by n-doped zone 15 includes exposed structures 60, permanent structures 70 and structural elements, which are connected to porous layer 30 by a supporting zone 40, thus forming a diaphragm support. Depending on the width of the n-doped structures, the structures may also be undercut and exposed as exemplified by exposed structures 60 of FIG. 1b.

An exemplary manufacturing method according to the present invention may consider the different dopings, n and p, for example, reacting differently to the electrochemical etching attack in semiconductor substrate 10. For example, the p-doped zones in semiconductor substrate 10 may be anodized well. However, the n-doped zones 15 may resist the etching attack. Consequently, the buried n-doped zones 15 may not be attacked during the anodizing. A porous film, which may superficially form on n-doped zones 15, may be eliminated by tempering in $H_2$ or by a short dip in silicon-etching solutions, such as, e.g., TMAH or solutions containing KOH. In this case, the etch front passes around n-doped zones 15.

As shown in FIG. 1c, the pores of porous silicon zone 30, which form an upper limit of cavity 50, are sealed by different processes. The deposition of a layer with oxide, nitride, metal, epitaxy or the oxidation of porous layer 30 to form sealing layer 75 are exemplary arrangements. Tempering in $H_2$, for example, at temperatures above 1000° C., may also result in a vacuum-tight seal. The pressure ratios during the sealing process determine the internal pressure arising in cavity 50, and $H_2$ may diffuse out by tempering.

The structure exemplified in FIG. 1c may be used as an acceleration sensor. Exposed structures 60 may be capable of vibrating in transverse accelerations, as a result of which the distance between exposed structures 60 and permanent structures 70 may periodically change. The change in distance may be analyzed capacitively by an interdigital capacitor. If a vacuum is to be enclosed under the sealing diaphragm made up of porous zone 30 and sealing layer 70, the sealing diaphragm may be stabilized by cited supporting zones 40.

Alternatively, all micromechanical structures manufactured using an exemplary method according to the present invention may be produced together with a corresponding integrated circuit, e.g., an evaluation circuit. For this purpose, an epitaxy layer may be deposited on the porous zone. The corresponding circuit components may be produced, for example, using CMOS, bipolar or mixed processes.

Figure 2:
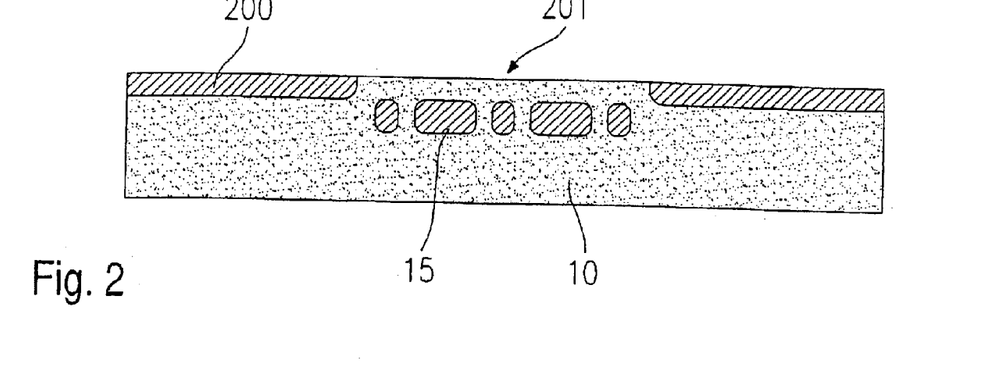
FIG. 2 is a micromechanical structure manufactured using another exemplary manufacturing method according to the present invention.

FIG. 2 is a micromechanical structure manufactured using another exemplary manufacturing method according to the present invention.

As shown in FIG. 2, reference symbol 200 denotes a doping mask and 201 denotes a doping mask opening. In contrast to metal mask 70 of FIGS. 1a–1c, an n-doping is used as mask 200 in this exemplary embodiment. The combination of an n-doping as a mask and an additional mask layer on the doped substrate surface, e.g., nitride, may also be used.

Figure 3A:
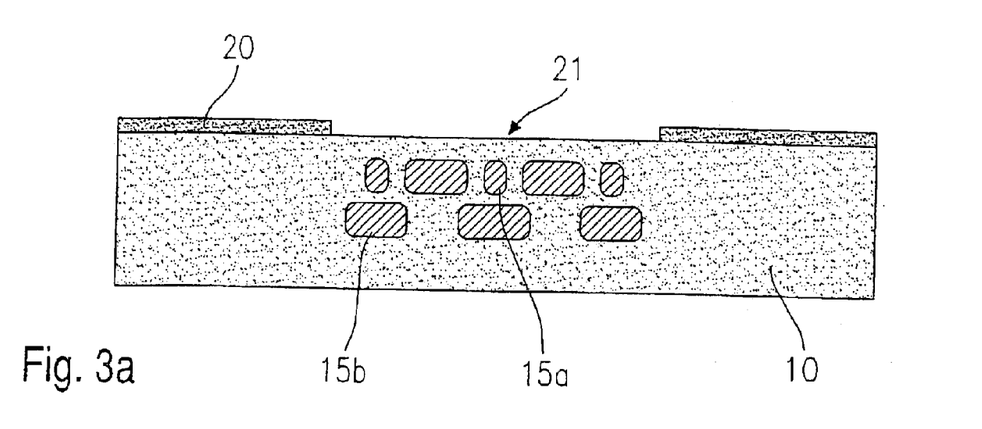
FIGS. 3a and 3b are cross-sectional views of a micromechanical component manufactured using another exemplary manufacturing method according to the present invention.
Figure 3B:
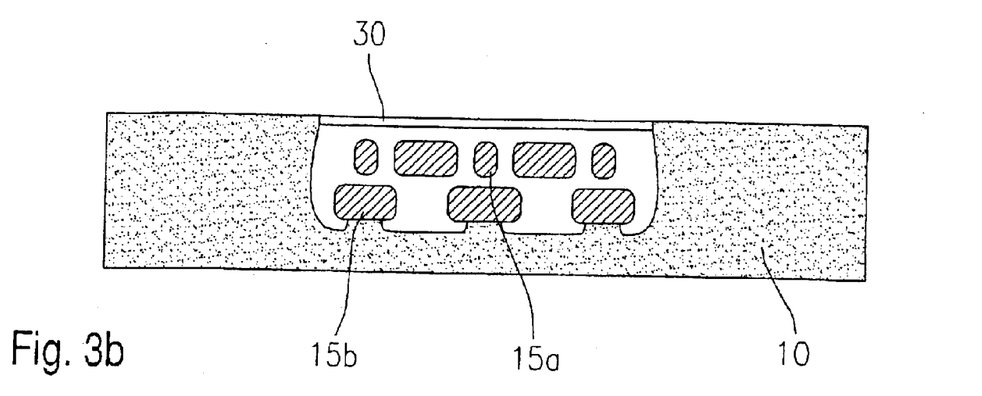

FIGS. 3a and 3b are cross-sectional views of a micromechanical component manufactured using another exemplary manufacturing method according to the present invention.

As shown in FIG. 3, n-doped zones 15a, 15b are provided at different depths, made possible by the selection of different implantation energies. As a result, structures having very complex depth profiles may be produced. As shown in FIGS. 3a and 3b, two different implantations are performed to produce the upper functional level having n-doped zones 15a and to produce the functional level having n-doped zones 15b. In other respects, the method steps occur in a similar manner, described above with reference to FIGS. 1a–1c.

The second functional level may be incorporated by depositing an epitaxy layer, into which the second functional level is implanted after the first functional level has been implanted.

FIGS. 4a–4d are cross-sectional views of a micromechanical component manufactured using yet another exemplary manufacturing method according to the present invention.

Figure 4A:
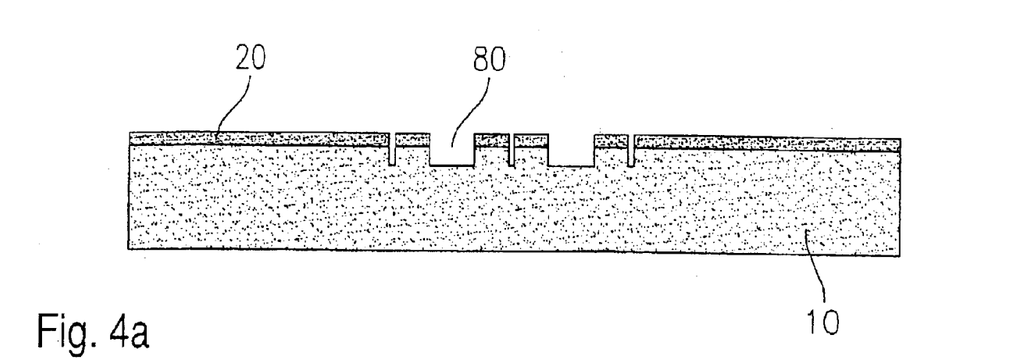
FIGS. 4a–4d are cross-sectional views of a micromechanical component manufactured using yet another exemplary manufacturing method according to the present invention.

In addition to the reference symbols previously introduced, FIG. 4a shows trenches 80 in p-doped semiconductor substrate 10. The trenches 80 may be introduced in semiconductor substrate 10, for example, using an etching method in combination with a hard mask.

Figure 4B:
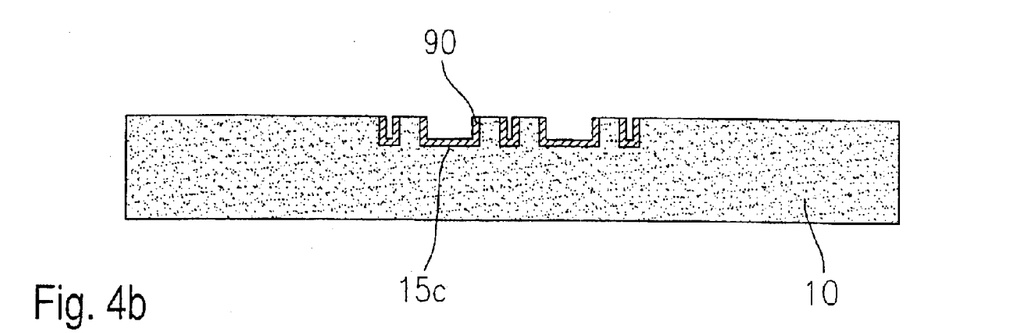
Figure 4C:
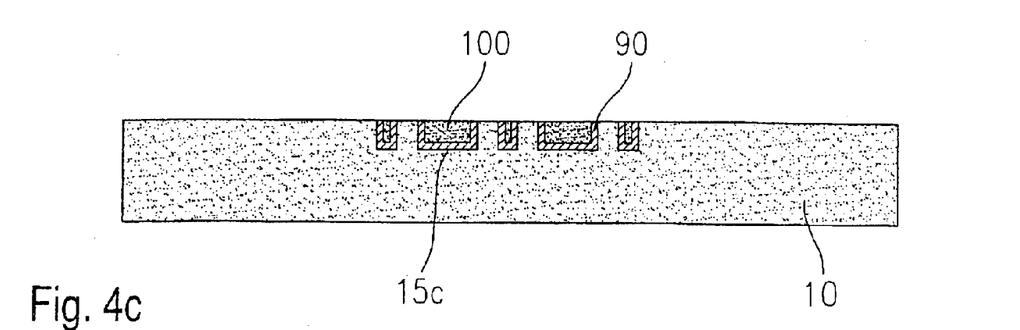

As shown in FIG. 4b, after the trenches 80 have been created, a chemical vapor deposition occurs with an n-doped deposition layer 90, e.g., epitaxial silicon, to form n-doped zones 15c. Subsequently, as shown in FIG. 4c, the trenches 80 are filled with a filler, e.g., polysilicon, and the resulting structure is planarized. Finally, an epitaxial polysilicon layer 150 is deposited as shown in FIG. 4d.

This procedure of trench formation, doping, filling and epitaxial deposition may be repeated cyclically to produce complex depth profiles. For example, this exemplary method according to the present invention may permit a very high-definition doping profile to be produced with a high aspect ratio. In addition to n-doped polysilicon, for example, oxide, BPSG, etc., may be used for filling. For example, filler 100 may be n-doped or p-doped, depending on the intended appearance of the resulting structure.

Figure 4D:
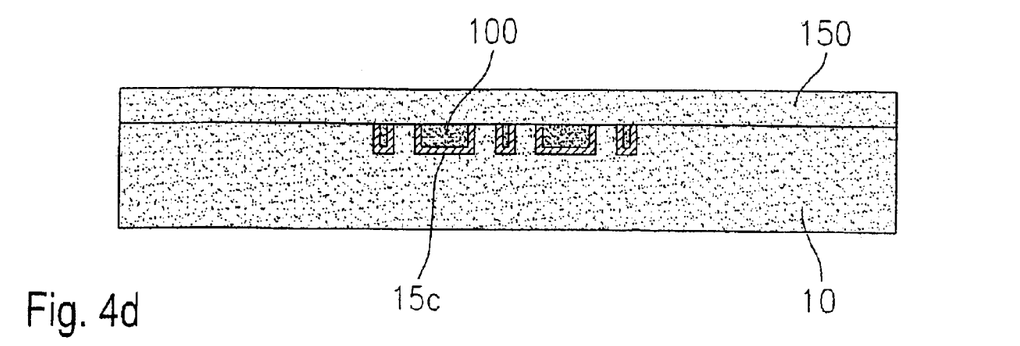

Following the exemplary procedure shown in FIG. 4d, the further process steps described above with reference to FIGS. 1b and 1c occur.

Figure 5A:
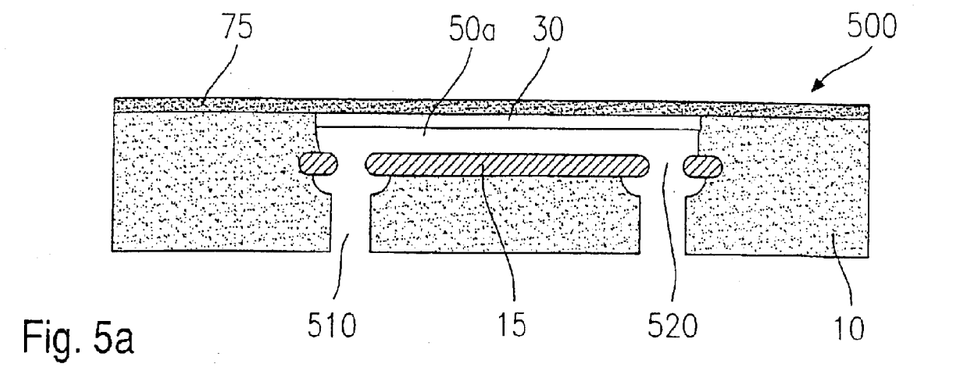
FIGS. 5a and 5b are cross-sectional views of an exemplary micromechanical component according to the present invention.
Figure 5B:
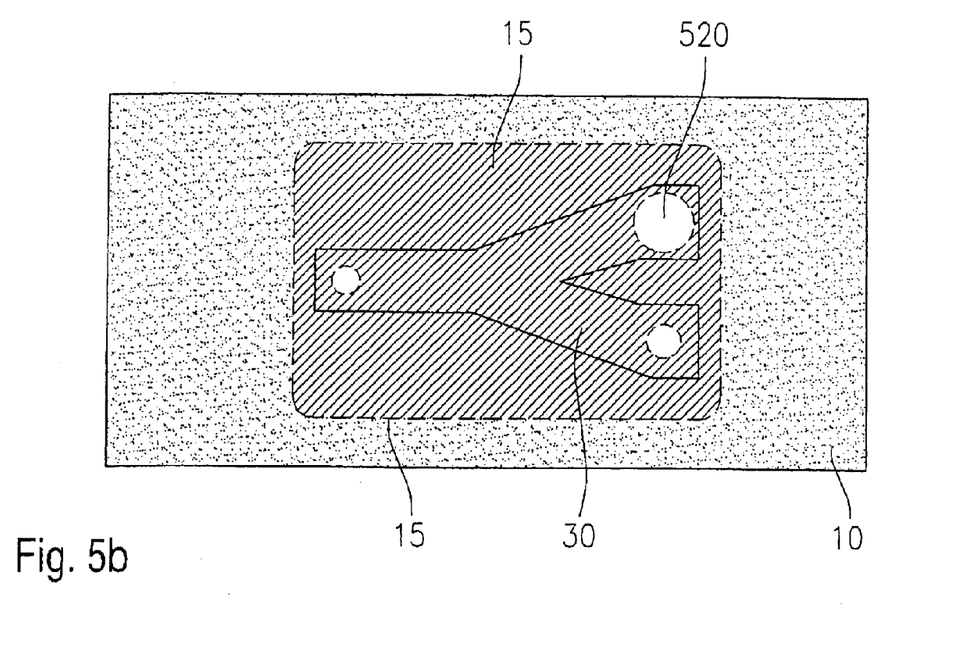

FIGS. 5a and 5b are cross-sectional views of an exemplary micromechanical component according to the present invention.

FIGS. 5a and 5b illustrate a branched flow channel having defined transfer openings. In this exemplary embodiment according to the present invention, the transfer openings are provided as back openings 510, while porous zone 30 is hermetically sealed by a sealing layer 75. N-doped zones 15 define the lower limit of cavity 50a and thus the bottom of the flow channel. The Y-shaped structure of the flow channel may be attained by suitable masking.

For example, transfer openings 520 may be provided in the structure shown in FIGS. 5a and 5b, which are provided in n-doped zone 15, so that, when back openings 510 are etched from the back, the passages do not become too large, which is indicated by the corresponding bell-shaped back etching profile. In this respect, n-doped zone 15 also acts as an etching stop for the etching from the back.

In the exemplary embodiment according to the present invention described with reference to FIGS. 5a and 5b, an additional epitaxy layer (not shown) may be deposited and power components (not shown), e.g., power transistors, may be implemented on the additional epitaxy layer. The flow channel may then carry a coolant liquid or a coolant gas or another coolant, so that the power components may be cooled from the back by thermal contact. Compared with cooling from the front, cooling from the back may not require the surface to be protected from the coolant. The flow channel may have a meandering shape or may be entwined in another direction for this application (not shown).

Figure 6A:
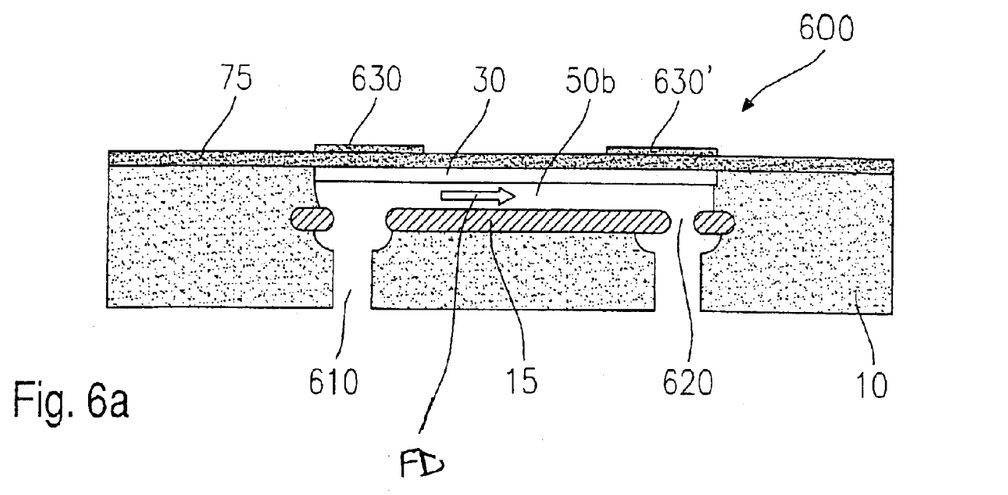
FIGS. 6a and 6b are cross-sectional views of a second exemplary micromechanical component according to the present invention.
Figure 6B:
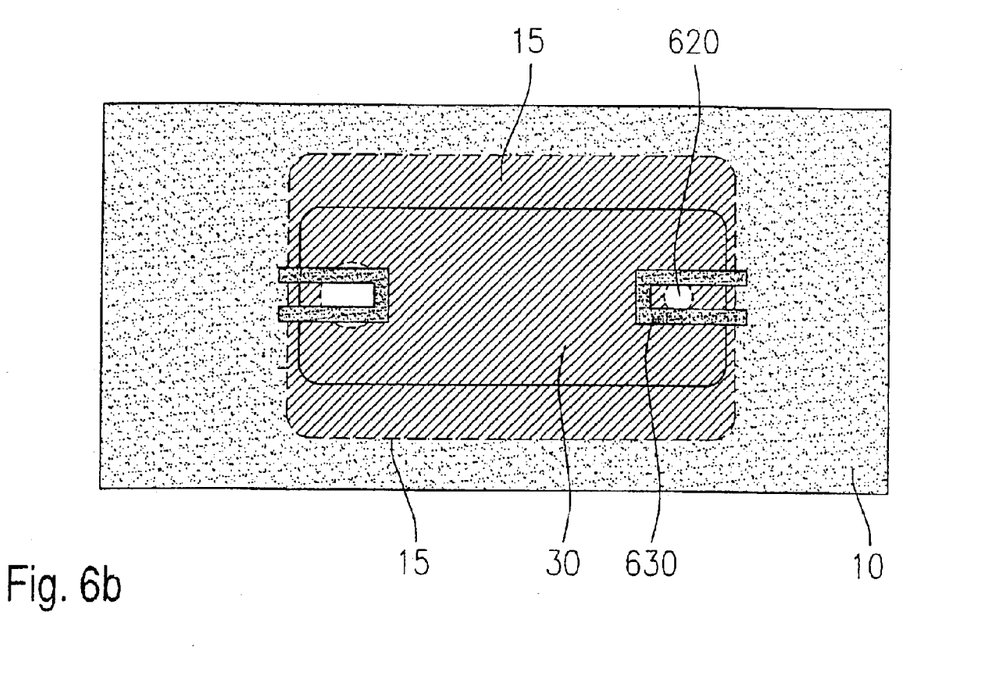

FIGS. 6a and 6b are cross-sectional views of a second exemplary micromechanical component according to the present invention.

In this exemplary embodiment according to the present invention, piezoresistive resistors 630, 630' are provided on the sealing layer above porous zone 30. Varying flow rates in flow direction FD result in a varying pressure, which subjects the diaphragm and thus piezoresistive resistors 630, 630' to a voltage of varying strength. The resulting change in resistance may be analyzed. A heating structure having temperature sensors analogous to the previous thermal mass flow sensors may also be used.

It is believed to be advantageous in that, due to the supply of the mass flow from the back, it may not be necessary to protect resistance elements 630, 630' against media.

Figure 7A:
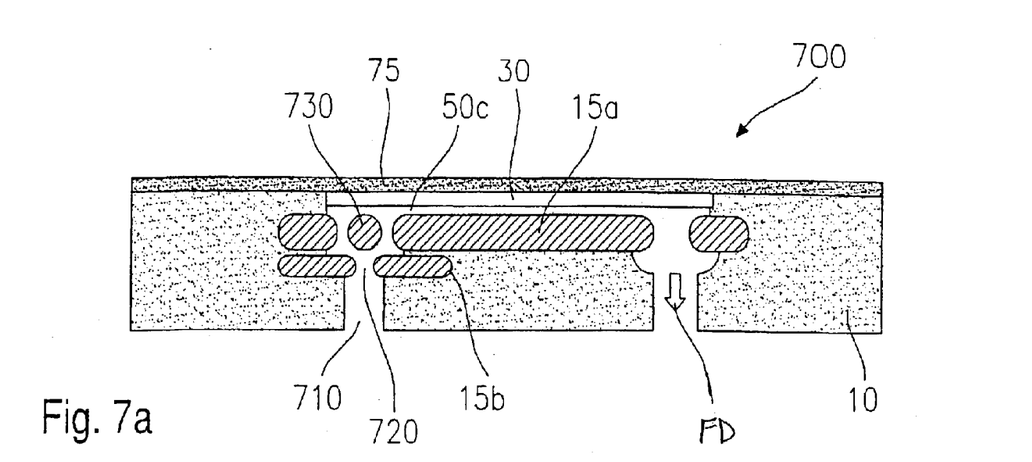
FIGS. 7a and 7b are cross-sectional views of a third exemplary micromechanical component according to the present invention.
Figure 7B:
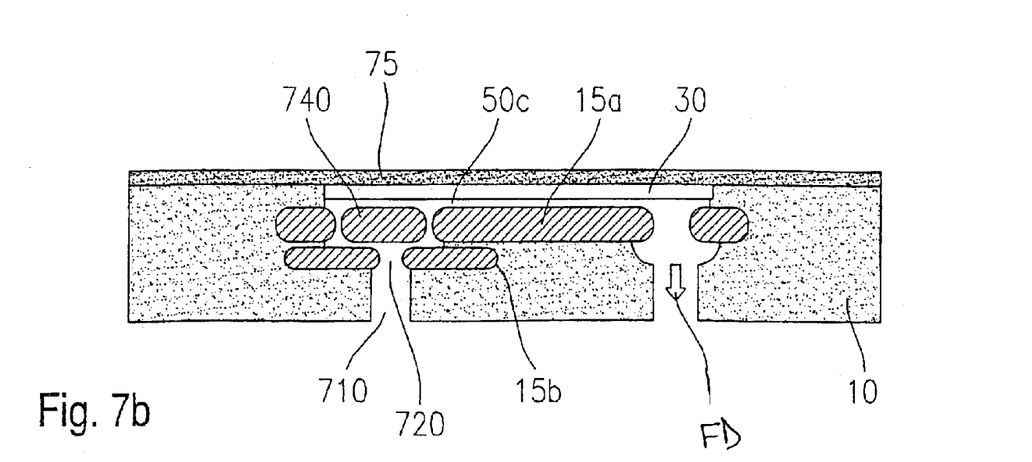

FIGS. 7a and 7b are cross-sectional views of a third exemplary micromechanical component according to the present invention.

An exemplary embodiment according to the present invention shown in FIGS. 7a and 7b, relates to a check valve, and includes a micro-sealing ball 730 and a micro-sealing plate 740 which, together with transfer opening 720 in n-doped zone 15b, form a check valve. Micro-sealing ball 730 and/or micro-sealing plate 740 are formed simultaneously with the flow channel and/or transfer opening 720 during the anodization process and seal off transfer opening 720 in the event of a return flow.

Figure 8A:
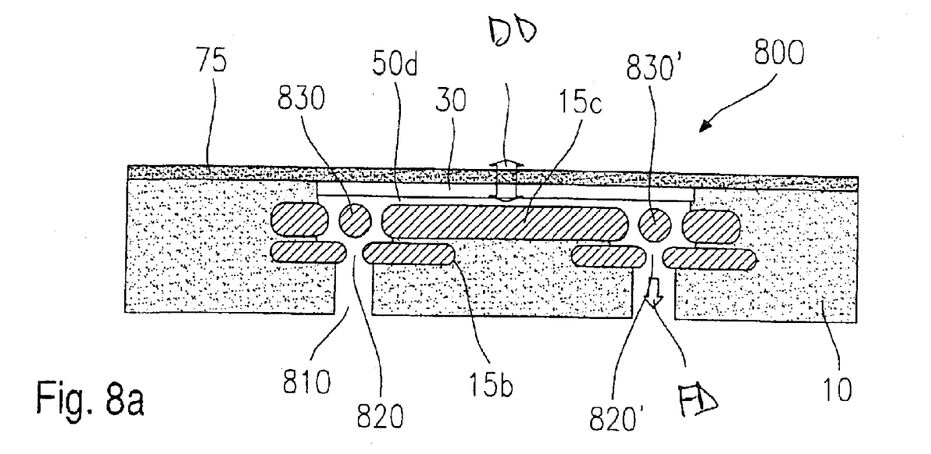
FIGS. 8a and 8b are cross-sectional views of a fourth exemplary micromechanical component according to the present invention.
Figure 8B:
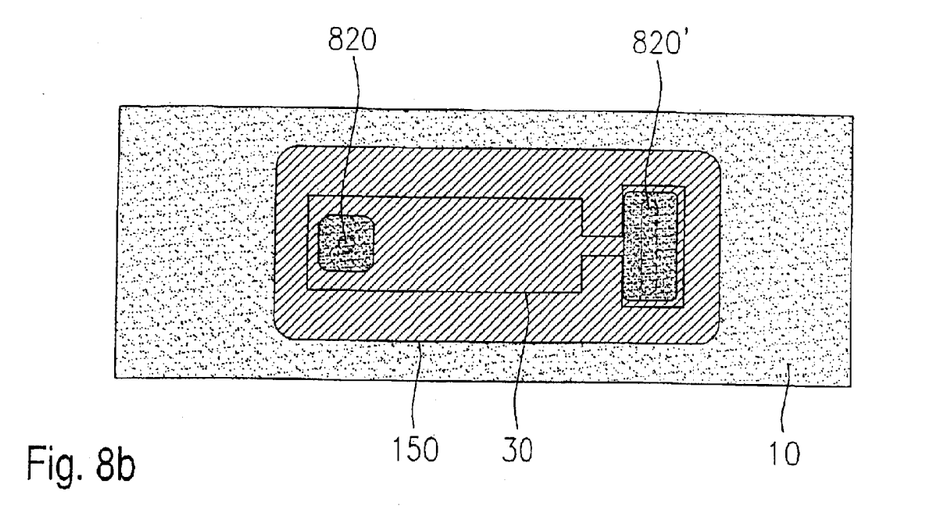

FIGS. 8a and 8b are cross-sectional views of a fourth exemplary micromechanical component according to the present invention.

The exemplary embodiment described with reference to FIGS. 8a and 8b is a micropump. The diaphragm contains porous zone 30, and sealing layer 70 is thinner and may be deflected in direction DD.

A deflection may be implemented, for example, by using a magnetic layer as sealing layer 75, which may be deflected by an electromagnet. The diaphragm may be thermally or electrostatically deflected. In doing so, cavity 50d is enlarged or reduced in volume, and the use of two different check valves 830, 830' permit a flow direction FD to be imposed. Check valve 830 has the shape of a ball, and check valve 830', in the form of an ellipsoid, which interacts with an elliptical, elongated opening.

When the diaphragm is deflected upwards, check valve 830' closes the right inlet, and liquid may flow past the check valve. Thus, liquid is drawn into the left transfer opening. With a downward deflection, left check valve 830 closes the round transfer opening, while liquid may flow past right check valve 830'. Thus, the liquid drawn in is pressed out through the right transfer opening.

Figure 9A:
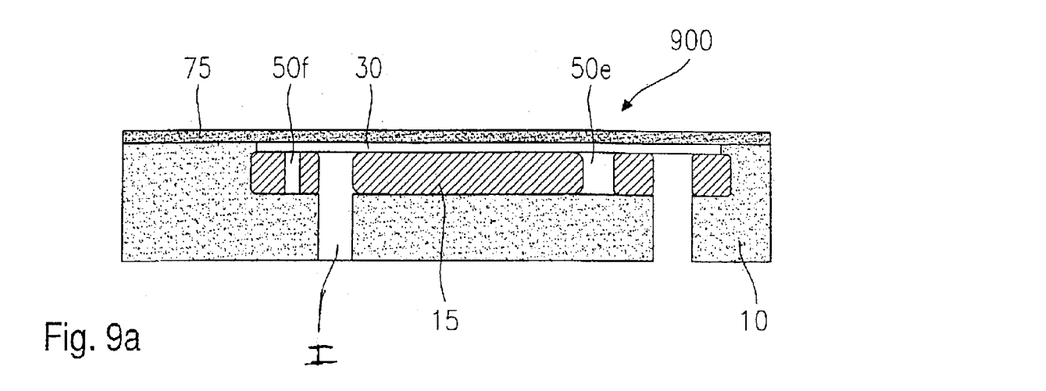
FIGS. 9a and 9b are cross-sectional views of a fifth exemplary micromechanical component according to the present invention.
Figure 9B:
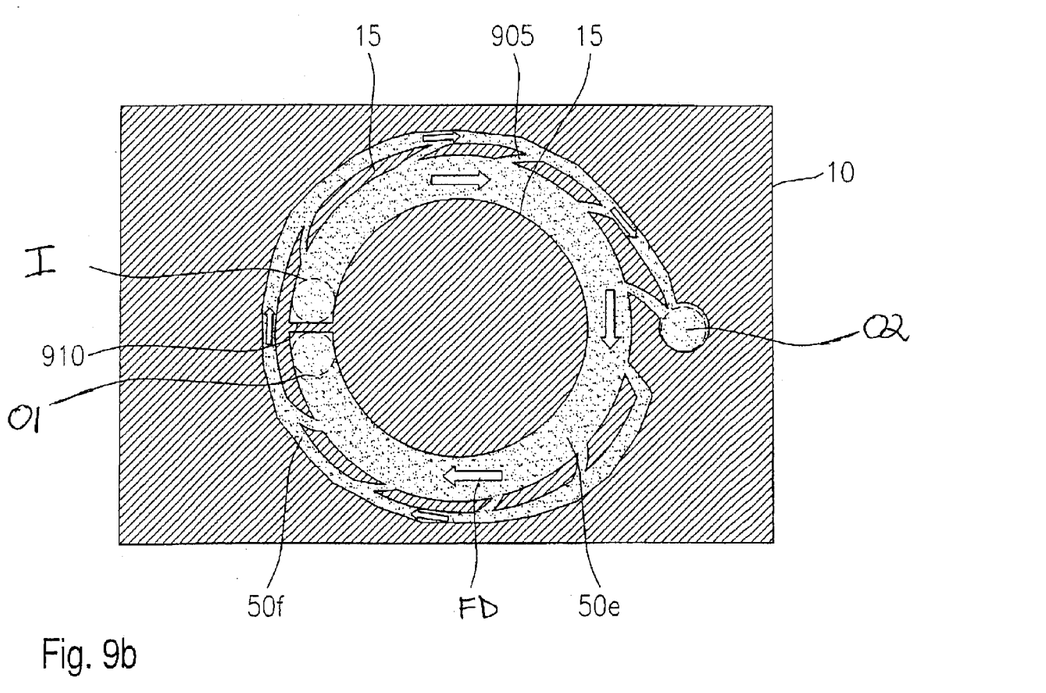

FIGS. 9a and 9b are cross-sectional views of a fifth exemplary micromechanical component according to the present invention.

The exemplary structure according to the present invention and described with reference to FIGS. 9a and 9b is a gas centrifuge. The gas centrifuge includes a circular inner flow channel 50e and a concentric outer flow channel 50f, which are connected by radial ports 905 in a separation zone 15 made of the substrate material. The inner flow channel is interrupted by a bar 910. A back inlet opening I is located on one side of the bar and a first back outlet opening O1 is provided on the other side of bar 910. A second back opening O2 is provided at the end of outer flow channel 50f. Thus, a medium flowing through back inlet opening I may be routed to first or second back outlet opening O1, O2 specific to mass by centrifugal force. That is, heavier gas components are pressed into outer flow channel 50f due to the centrifugal force, while the lighter gas components remain in inner flow channel 50e. To intensify the affected separation effect, a plurality of such gas centrifuges may, for example, be connected in series, one after the other.

It should be noted that the present invention is not limited to the various exemplary embodiments described above, but rather may be modified in a variety of ways.

For example, micromechanical base materials such as, e.g., germanium, may be used instead of the silicon substrate. Also, sensor structures may be formed.

What is claimed is:

1. A micromechanical component comprising:
   a substrate made from a first substrate material having a first doping type, the substrate including a micromechanical functional structure; and
   a cover layer at least partially covering the micromechanical functional structure;
   wherein the micromechanical functional structure includes at least one zone made from a second substrate material having a second doping type, the at least one zone is at least partially surrounded by a cavity, and the cover layer includes a porous layer made from the substrate material.

2. The micromechanical component of claim 1, wherein at least one of the at least one zone includes a supporting zone for supporting the porous layer.

3. The micromechanical component of claim 1, wherein at least one of the at least one zone is one of completely detached from surroundings and resiliently connected to the substrate.

4. The micromechanical component of claim 1, wherein the substrate includes at least one trench partially filled with a doping material having the second doping type and at least partially filled with a filler.

5. The micromechanical component of claim 1, wherein the first and second substrate materials include silicon.

6. The micromechanical component of claim 1, wherein the zones of the substrate are situated at different depths of the substrate.

7. The micromechanical component of claim 1, wherein the cavity includes a vacuum.

8. The micromechanical component of claim 1, further comprising:
   a scaling layer to seal pores of the porous layer.

9. The micromechanical component of claim 8, wherein the sealing layer includes an oxide layer formed on the porous layer.

10. The micromechanical component of claim 8, further comprising:
    a detection device for piezoresistively detecting a flow rate, the detection device being on the sealing layer.

11. The micromechanical component of claim 8, further comprising:
    two check valve devices having different dimensions, each of the check valve devices situated above a respective one of transfer openings, the porous layer with the sealing layer being operable as a pump diaphragm.

12. The micromechanical component of claim 8, wherein a predetermined atmosphere is set by the sealing layer.

13. The micromechanical component of claim 8, further comprising:
    at least one piezoresistive resistor arranged on the sealing layer above the porous layer.

14. The micromechanical component of claim 1, wherein the cavity includes a flow channel connected to at least two back openings.

15. The micromechanical component of claim 14, wherein the at least two back openings are connected by respective transfer openings, and each of the respective transfer openings are formed in the zone.

16. The micromechanical component of claim 15, further comprising:
    a check valve device in the flow channel and above a corresponding one of the respective transfer openings within the flow channel, the check valve device including at least one of the zones.

17. The micromechanical component of claim 1, wherein the cavity includes a circular inner flow channel and a concentric outer flow channel connected by radial ports in a separation zone made from the second substrate material, the inner flow channel is interrupted by a bar, a back inlet opening is arranged on one side of the bar, a first back outlet opening is arranged on an other side of the bar, and a second back outlet opening is arranged in the outer flow channel, so that a medium flowing through the back inlet opening may be separated in accordance with a mass of the medium by a centrifugal force through the first and second back outlet openings.

* * * * *